(12) United States Patent
Aoyama

(10) Patent No.: US 8,198,670 B2
(45) Date of Patent: Jun. 12, 2012

(54) NONVOLATILE SEMICONDUCTOR MEMORY DEVICE

(75) Inventor: Kenji Aoyama, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 202 days.

(21) Appl. No.: 12/713,652

(22) Filed: Feb. 26, 2010

(65) Prior Publication Data

US 2010/0237400 A1 Sep. 23, 2010

(30) Foreign Application Priority Data

Mar. 18, 2009 (JP) ................... 2009-066180

(51) Int. Cl.
*H01L 29/792* (2006.01)
(52) U.S. Cl. ........ 257/324; 257/390; 257/316; 257/326; 257/E29.309; 257/E27.06; 438/152
(58) Field of Classification Search .................. 257/324, 257/E29.309, E27.06, E21.536, 390, 316, 257/326, 331; 438/152
See application file for complete search history.

(56) References Cited

U.S. PATENT DOCUMENTS

2007/0252201 A1 11/2007 Kito et al.
2008/0173928 A1* 7/2008 Arai et al. ..................... 257/316

FOREIGN PATENT DOCUMENTS

| JP | 10-321736 | 12/1998 |
|---|---|---|
| JP | 2001-273759 | 10/2001 |
| JP | 2007-266143 | 10/2007 |
| JP | 2007-317795 | 12/2007 |

* cited by examiner

*Primary Examiner* — Cuong Q Nguyen
*Assistant Examiner* — Cathy N Lam
(74) *Attorney, Agent, or Firm* — Oblon, Spivak, McClelland, Maier & Neustadt, L.L.P.

(57) ABSTRACT

A nonvolatile semiconductor memory device includes: a multilayer body with a plurality of insulating films and electrode films alternately stacked therein; a plurality of select gate electrodes provided on the multilayer body, extending in one direction orthogonal to a stacking direction of the multilayer body, and spaced from each other; semiconductor pillars penetrating through the multilayer body and the select gate electrodes; and a charge storage film provided between one of the electrode films and one of the semiconductor pillars, two neighboring ones of the semiconductor pillars penetrating through a common one of the select gate electrodes and penetrating through mutually different positions in a width direction of the select gate electrodes.

10 Claims, 8 Drawing Sheets

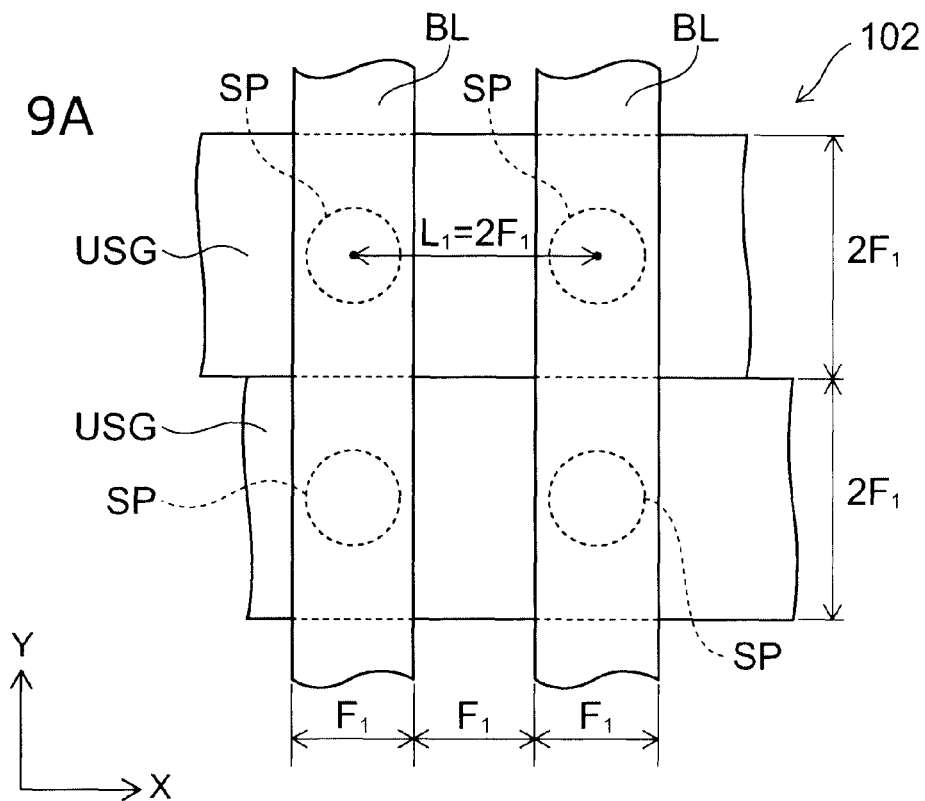
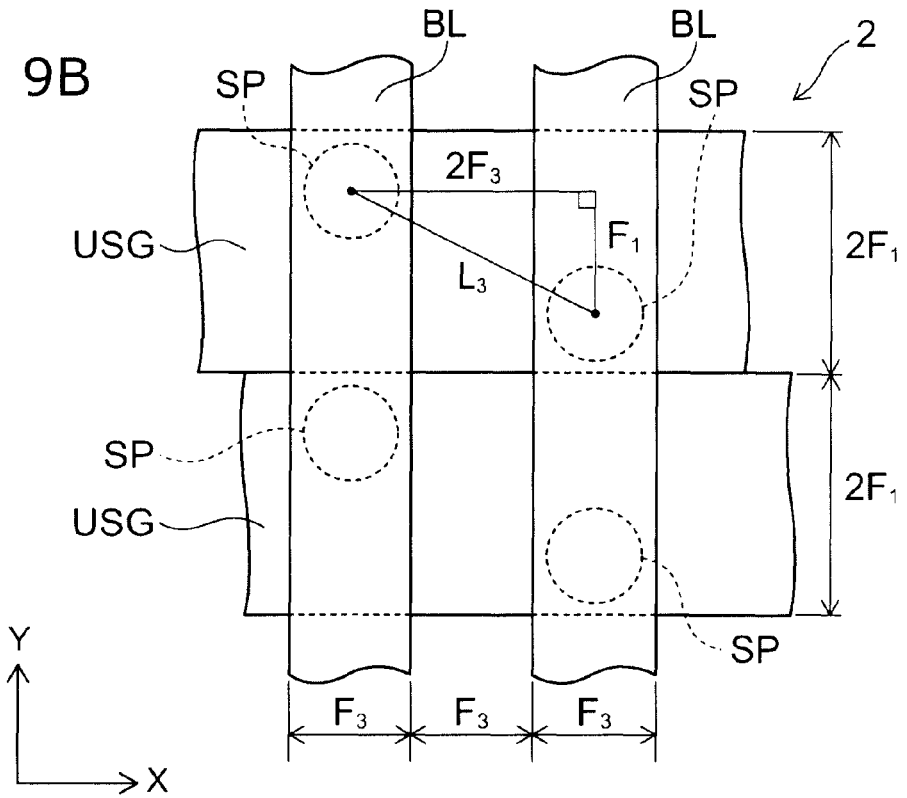

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2009-66180, filed on Mar. 18, 2009; the entire contents of which are incorporated herein by reference.

BACKGROUND OF THE INVENTION

1. Field of the Invention

This invention relates to a nonvolatile semiconductor memory device with a plurality of insulating films and a plurality of electrode films alternately stacked therein.

2. Background Art

In recent years, the integration density of nonvolatile semiconductor memory devices has been rapidly increasing. For instance, JP-A 2007-266143 (Kokai) proposes a three-dimensionally structured nonvolatile semiconductor memory device in which memory cells are vertically stacked on one silicon substrate. In this technique disclosed in JP-A 2007-266143 (Kokai), electrode films and insulating films are alternately stacked on a silicon substrate to form a multilayer body, and then through holes are simultaneously formed in this multilayer body. A charge storage film is formed on the side surface of the through hole, and a silicon pillar is buried inside the through hole. Thus, a memory cell is formed at an intersection between each of the electrode films and the silicon pillar.

In this three-dimensionally structured nonvolatile semiconductor memory device, information can be stored by controlling the potential of each electrode film and each silicon pillar to transfer charge between the silicon pillar and the charge storage film. In this technique, a plurality of electrode films are stacked on the silicon substrate to reduce the chip area per bit, and it allows cost reduction. Furthermore, because the multilayer body is simultaneously processed, increase in the number of stacked films does not result in increasing the number of lithography steps, and cost increase can be suppressed.

However, even in such a three-dimensionally structured nonvolatile semiconductor memory device, still higher integration density is desired.

SUMMARY OF THE INVENTION

According to an aspect of the invention, there is provided a nonvolatile semiconductor memory device including: a multilayer body with a plurality of insulating films and electrode films alternately stacked therein; a plurality of select gate electrodes provided on the multilayer body, extending in one direction orthogonal to a stacking direction of the multilayer body, and spaced from each other; semiconductor pillars penetrating through the multilayer body and the select gate electrodes; and a charge storage film provided between one of the electrode films and one of the semiconductor pillars, two neighboring ones of the semiconductor pillars penetrating through a common one of the select gate electrodes and penetrating through mutually different positions in a width direction of the select gate electrodes.

According to another aspect of the invention, there is provided a nonvolatile semiconductor memory device including: a multilayer body with a plurality of insulating films and electrode films alternately stacked therein; a plurality of select gate electrodes provided on the multilayer body, extending in one direction orthogonal to a stacking direction of the multilayer body, and spaced from each other; semiconductor pillars penetrating through the multilayer body and the select gate electrodes; and a charge storage film provided between one of the electrode films and one of the semiconductor pillars, a straight line being orthogonal to the stacking direction and connecting between central axes of two of the semiconductor pillars located at shortest distance being sloped with respect to both the one direction and another direction orthogonal to the stacking direction and the one direction.

BRIEF DESCRIPTION OF THE DRAWINGS

FIG. 5A shows the device according to the comparative example, and FIG. 5B shows the device according to the first embodiment;

FIGS. 9A and 9B are schematic plan views illustrating the effect of the second embodiment, where FIG. 9A shows the device according to the comparative example, and FIG. 9B shows the device according to the second embodiment.

DETAILED DESCRIPTION

Embodiments of the invention will now be described with reference to the drawings.

At the outset, a first embodiment of the invention is described.

Figure 1:
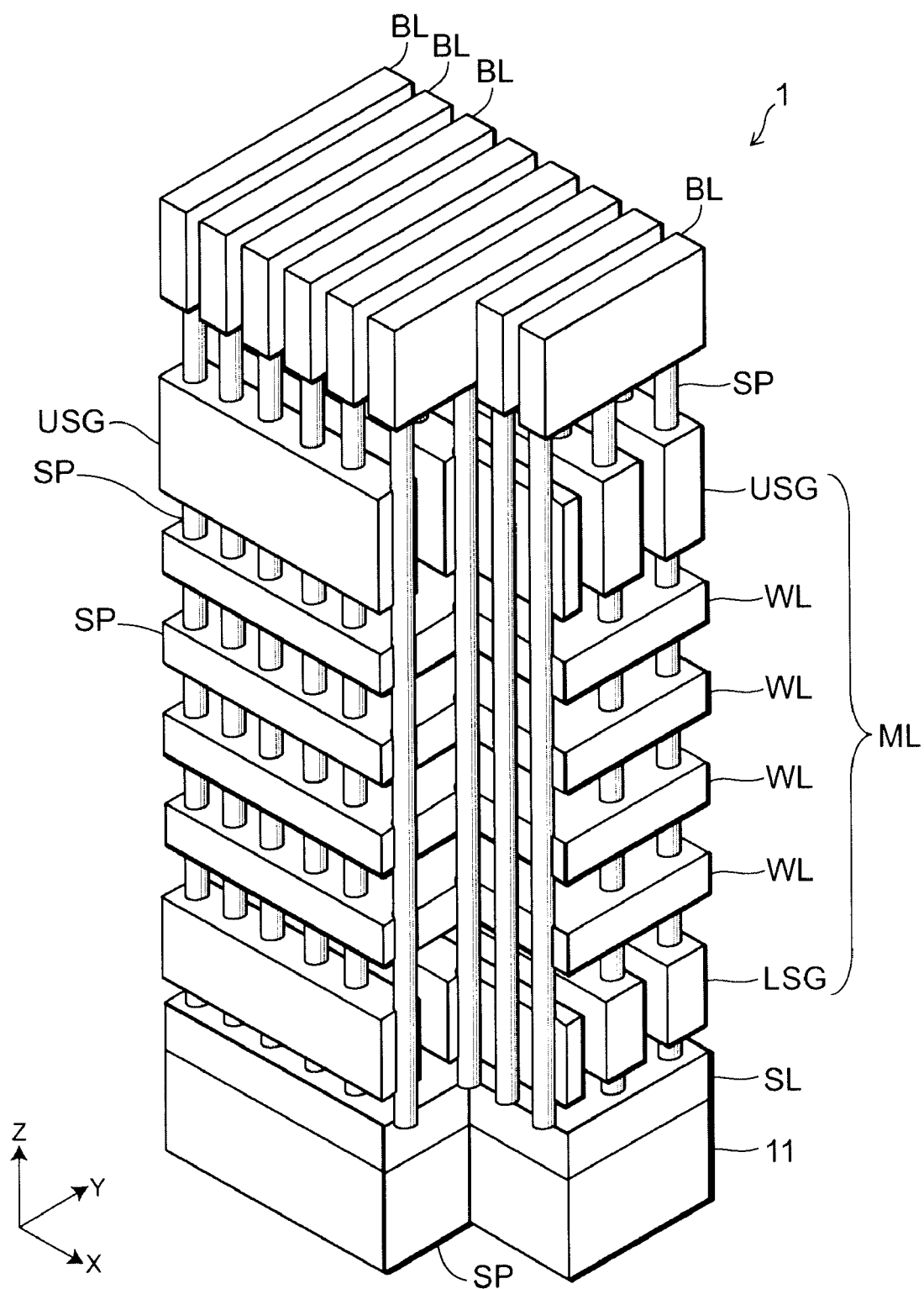
FIG. 1 is a perspective cross-sectional view illustrating a nonvolatile semiconductor memory device according to a first embodiment of the invention.

FIG. 1 is a perspective cross-sectional view illustrating a nonvolatile semiconductor memory device according to this embodiment.

Figure 2:
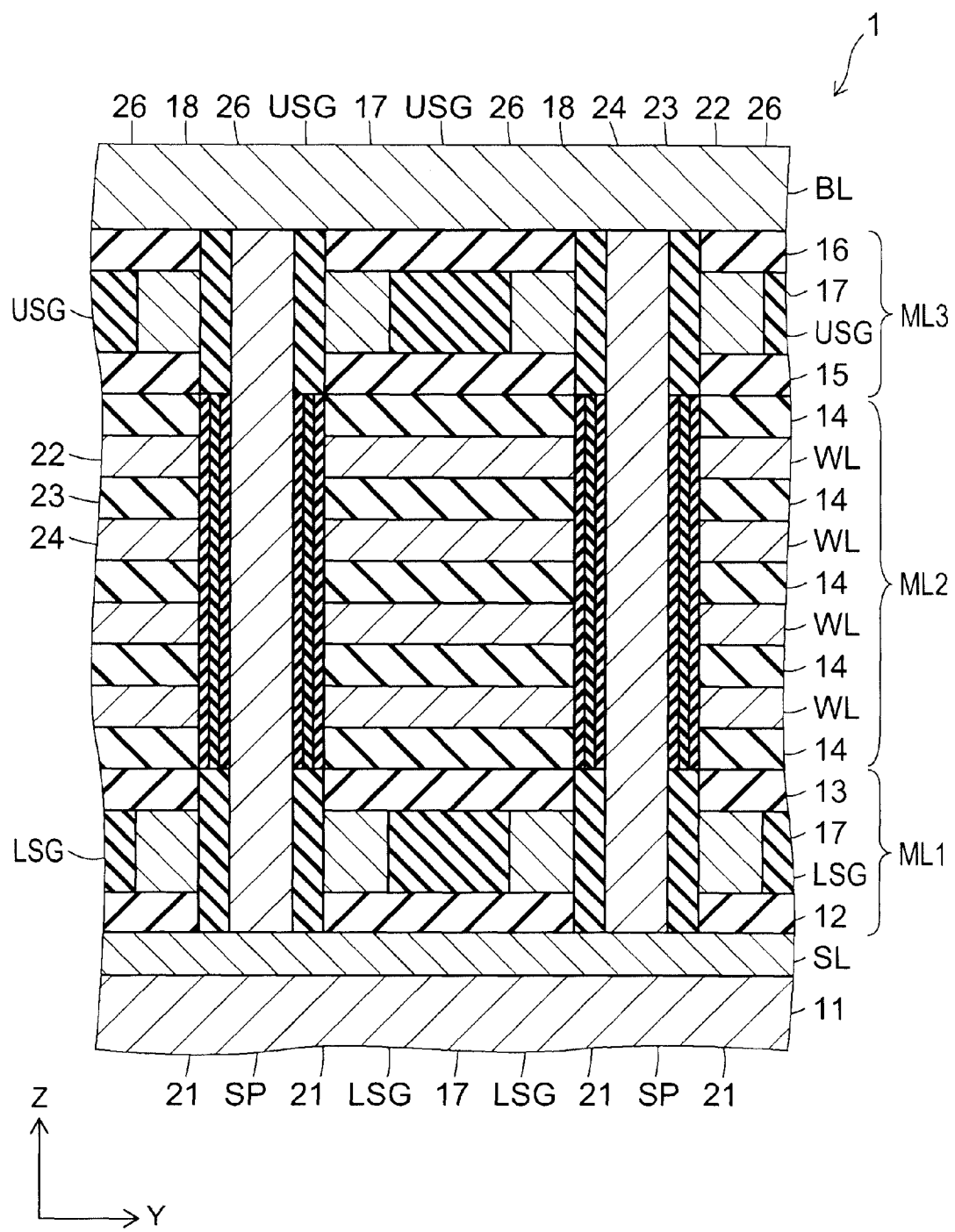
FIG. 2 is a cross-sectional view illustrating the nonvolatile semiconductor memory device according to the first embodiment.

FIG. 2 is a cross-sectional view illustrating the nonvolatile semiconductor memory device according to this embodiment.

Figure 3:
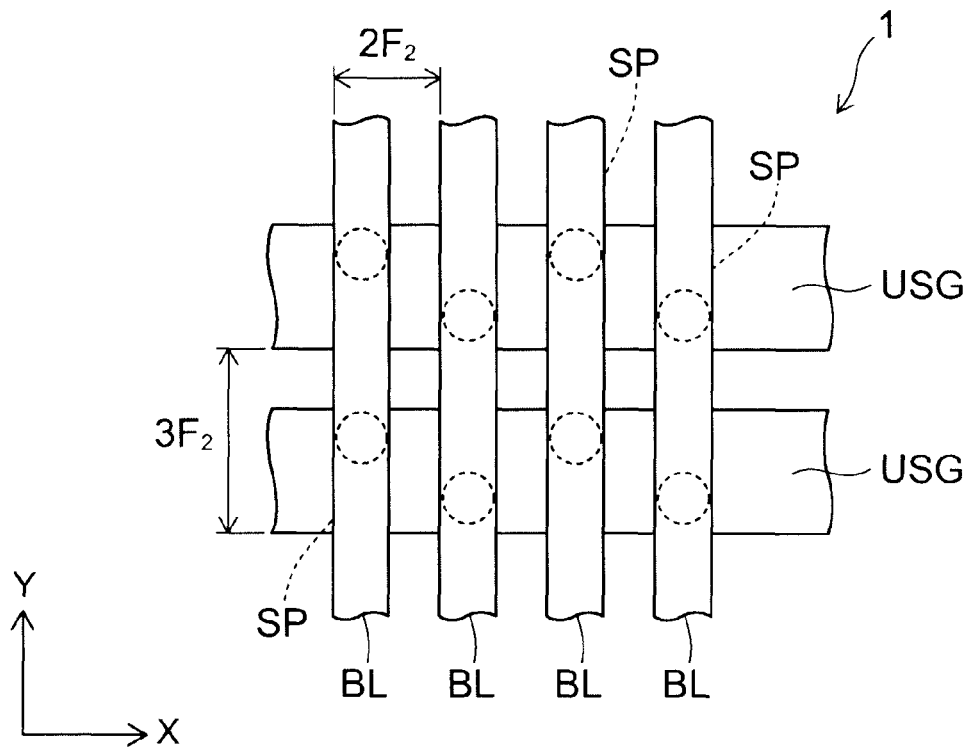
FIG. 3 is a schematic plan view illustrating how bit lines and upper select gate electrodes are positionally related to silicon pillars in the nonvolatile semiconductor memory device according to the first embodiment.

FIG. 3 is a schematic plan view illustrating how bit lines and upper select gate electrodes are positionally related to silicon pillars in the nonvolatile semiconductor memory device according to this embodiment.

As shown in FIGS. 1 and 2, the nonvolatile semiconductor memory device 1 (hereinafter also simply referred to as "device 1") according to this embodiment is a three-dimensional multilayer flash memory. As described later, a plurality of electrode films WL spaced from each other are stacked in the device 1, and a plurality of silicon pillars SP penetrate through these electrode films WL. Thus, a cell transistor is formed at each intersection between the electrode film and the silicon pillar. Furthermore, each cell transistor is provided with a charge storage film and functions as a memory cell for storing data by storing charge in this charge storage film.

As shown in FIG. 3, this embodiment is characterized in that the silicon pillars SP are arranged in a staggered layout as viewed from above. This can increase the integration density of memory cells by densely arranging the silicon pillars with the shortest distance between the silicon pillars SP maintained at a certain value or more.

For convenience of illustration, FIGS. 1 and 3 show only the conductive portions, and omit the insulating portions. In FIG. 1, the staggered arrangement of the silicon pillars is not represented, but they are drawn as having a simple matrix arrangement. In the following, the overall configuration of the device 1 is briefly described, and subsequently the aforementioned characteristic feature of this embodiment is described in detail.

First, the overall configuration of the device 1 is briefly described.

As shown in FIGS. 1 and 2, the nonvolatile semiconductor memory device 1 according to this embodiment includes a silicon substrate 11 illustratively made of single crystal silicon. In a surface portion of the silicon substrate 11, a source line SL is formed by ion implantation.

A lower gate multilayer body ML1 is provided on the silicon substrate 11. The lower gate multilayer body ML1 includes an insulating film 12, a lower select gate electrode LSG, and an insulating film 13, which are stacked in this order.

A memory multilayer body ML2 is provided above the lower gate multilayer body ML1. In the memory multilayer body ML2, a plurality of insulating films 14 and a plurality of electrode films WL are alternately stacked. The electrode film WL functions as a word line of the device 1. The insulating film 14 functions as an interlayer insulating film for insulating the electrode films WL from each other. The insulating film 14 is provided also on the uppermost electrode film WL. Although the number of electrode films WL provided in the example shown in FIG. 1 is four, the invention is not limited thereto.

Furthermore, an upper gate multilayer body ML3 is provided above the memory multilayer body ML2. The upper gate multilayer body ML3 includes an insulating film 15, an upper select gate electrode USG, and an insulating film 16, which are stacked in this order.

In the following, for convenience of description, an XYZ orthogonal coordinate system is herein introduced. In this coordinate system, the two directions parallel to the upper surface of the silicon substrate 11 and orthogonal to each other are referred to as X and Y directions, and the direction orthogonal to both the X and Y directions, or the stacking direction of the aforementioned films, is referred to as a Z direction.

The upper select gate electrode USG and the lower select gate electrode LSG are each formed by dividing one conductive film in the Y direction into a plurality of wiring-shaped conductive members extending in the X direction. The space around the upper select gate electrode USG and the lower select gate electrode LSG is buried with an insulating film 17. On the other hand, the electrode film WL is divided in units of erasure blocks and forms one conductive film parallel to the XY plane in each erasure block. Alternatively, the electrode film WL may also be divided in the Y direction, like the upper select gate electrode USG and the lower select gate electrode LSG. That is, the electrode film WL may be divided corresponding to the region immediately below the upper select gate electrode USG. The lower select gate electrode LSG, the electrode film WL, and the upper select gate electrode USG are formed from a conductive material, such as amorphous silicon or polysilicon provided with conductivity by impurity doping. The insulating films 12-17 are formed from an insulating material, such as silicon oxide. It is noted that a film necessary for processing, such as a stopper film made of silicon nitride, may be provided at any position between the films.

A plurality of through holes 18 extending in the stacking direction (Z direction) are formed in the lower gate multilayer body ML1, the memory multilayer body ML2, and the upper gate multilayer body ML3 (hereinafter collectively referred to as "multilayer body ML"). Each of the through holes 18 penetrates entirely through the multilayer body ML. A silicon pillar SP as a semiconductor pillar is buried inside each of the through holes 18. The silicon pillar SP is formed from a semiconductor material, such as amorphous silicon. The silicon pillar SP may be formed from other semiconductor materials, such as polysilicon, which are not necessary whether doped with impurities or not. The silicon pillar SP is shaped like a column, such as a cylindrical column, extending in the Z direction. The silicon pillar SP is provided throughout the length of the multilayer body ML in the stacking direction, and its lower end is connected to the source line SL of the silicon substrate 11.

A lower gate insulating film 21 illustratively made of silicon oxide is provided between the silicon pillar SP and the lower select gate electrode LSG. Thus, a lower select transistor is formed in the lower gate multilayer body ML1, with the silicon pillar SP serving as a body region including a channel region, the lower gate insulating film 21 serving as a gate insulating film, and the lower select gate electrode LSG serving as a gate electrode.

In the memory multilayer body ML2, a block insulating film 22, a charge storage film 23, and a tunnel insulating film 24 are stacked in this order on the inner surface of the through hole 18. That is, the block insulating film 22, the charge storage film 23, and the tunnel insulating film 24 are located between the silicon pillar SP and the electrode film WL. The block insulating film 22 is in contact with the electrode film WL, and the tunnel insulating film 24 is in contact with the silicon pillar SP.

The block insulating film 22 is a film, which passes no substantial current even if a voltage within the driving voltage range of the device 1 is applied. The block insulating film 22 is formed from a high dielectric material, such as alumina, which is illustratively formed from a material having a higher dielectric constant than the material forming the charge storage film 23. The charge storage film 23 is a film capable of retaining charge, such as a silicon nitride film, which is illustratively a film containing electron trap sites. The tunnel insulating film 24 is a film, which is normally insulative but passes a tunnel current when a prescribed voltage within the driving voltage range of the device 1 is applied. The tunnel insulating film 24 is illustratively made of a monolayer silicon oxide film or an ONO film (oxide-nitride-oxide film).

Furthermore, an upper gate insulating film 26 illustratively made of silicon oxide is provided between the silicon pillar SP and the upper select gate electrode USG. Thus, an upper select transistor is formed in the upper gate multilayer body ML3, with the silicon pillar SP serving as a body region including a channel region, the upper gate insulating film 26 serving as a gate insulating film, and the upper select gate electrode USG serving as a gate electrode. In this embodiment, all the upper select gate electrodes USG are located in the same layer.

Moreover, a plurality of bit lines BL extending in the Y direction are provided on the upper gate multilayer body ML3. The bit line BL is formed from a metal. Each of the bit lines BL is disposed so as to pass immediately above one sequence of silicon pillars SP arranged along the Y direction and is connected to the upper end of the silicon pillars SP. Thus, the silicon pillar SP is connected between the bit line BL and the source line SL. Furthermore, the silicon pillars SP in different sequences extending in the Y direction are connected to different bit lines BL.

Next, the characteristic feature of this embodiment is described.

As shown in FIG. 3, in the device 1, two neighboring silicon pillars SP penetrating through a common upper select gate electrode USG penetrate through different positions in the width direction (Y direction) of the upper select gate electrode USG. More specifically, a plurality of silicon pillars SP penetrating through a common upper select gate electrode USG penetrate alternately along the X direction through one side and the other in the width direction (Y direction) of the upper select gate electrode USG, and a plurality of silicon pillars SP arranged along the Y direction penetrate through the same side in the width direction (Y direction) of the upper select gate electrode USG.

That is, a plurality of silicon pillars SP commonly connected to a bit line BL penetrate through the upper select gate electrodes USG all on the same side, such as the +Y-side, in its width direction, and a plurality of silicon pillars SP commonly connected to another bit line BL neighboring the former bit line BL penetrate through the upper select gate electrodes USG all on the other side, such as the −Y-side, in its width direction. Consequently, as viewed in the Z direction, the silicon pillars SP are arranged in a staggered layout. This also applies to the positional relationship between the lower select gate electrodes LSG and the silicon pillars SP.

Next, a comparative example of this embodiment is described in order to describe the operation and effect of this embodiment.

Figure 4:
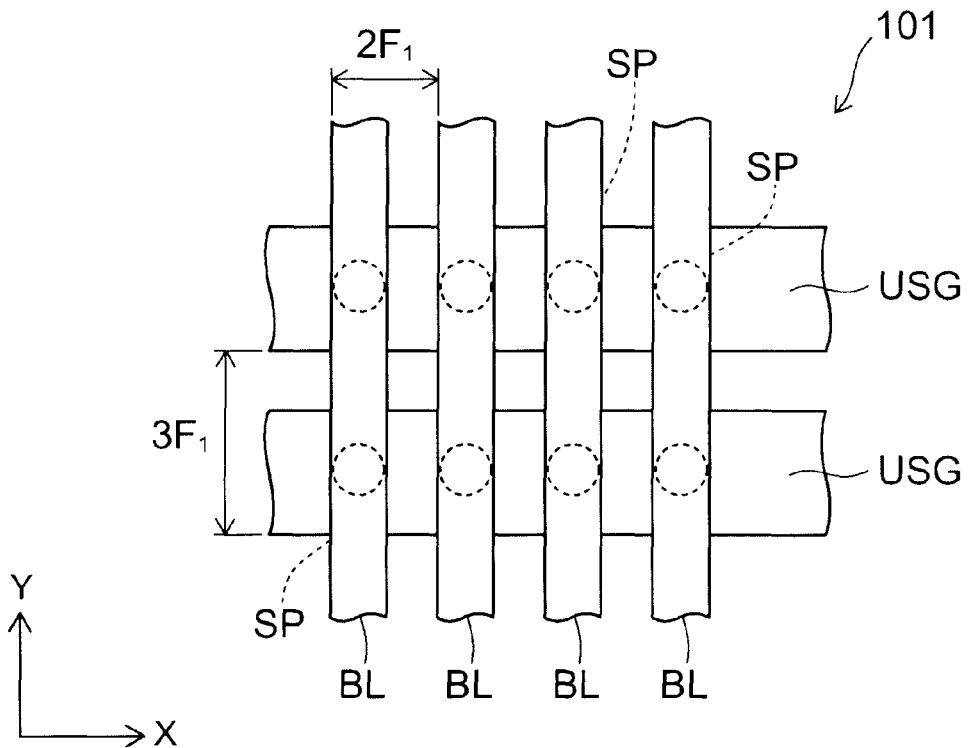
FIG. 4 is a schematic plan view illustrating how bit lines and upper select gate electrodes are positionally related to silicon pillars in a nonvolatile semiconductor memory device according to a comparative example of the first embodiment.

FIG. 4 is a schematic plan view illustrating how bit lines and upper select gate electrodes are positionally related to silicon pillars in a nonvolatile semiconductor memory device according to the comparative example of this embodiment.

As shown in FIG. 4, in the nonvolatile semiconductor memory device 101 according to the comparative example, all the silicon pillars SP penetrate through the same position, such as the center, in the width direction of the upper select gate electrode USG. Thus, as viewed in the Z direction, the silicon pillars SP are arranged in a matrix layout along the X and Y directions. The configuration of this comparative example other than the foregoing is the same as that of the first embodiment.

In the following, the operation and effect of this embodiment are described in comparison with the comparative example described above.

Figure 5A:
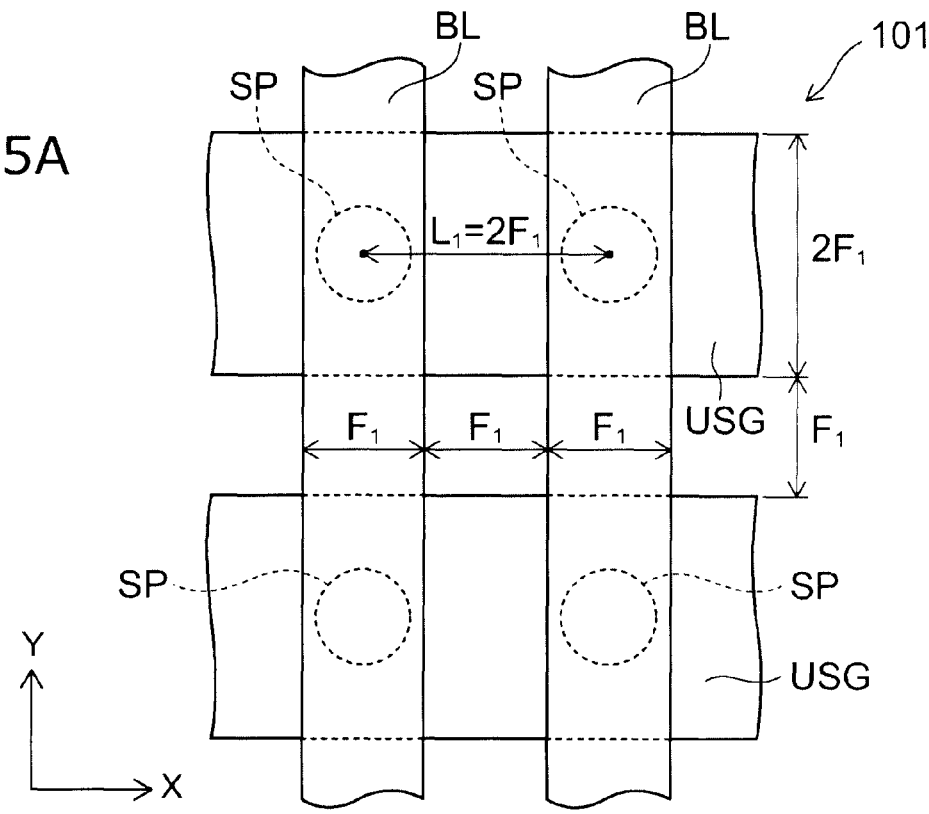
FIGS. 5A and 5B are schematic plan views illustrating the effect of the first embodiment, where
Figure 5B:
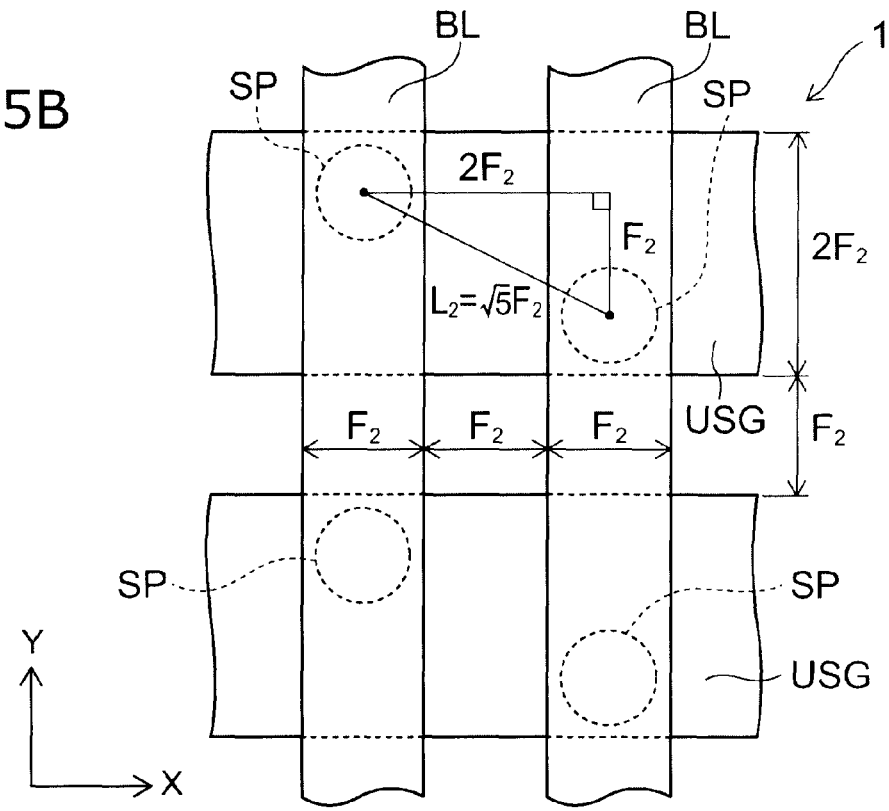

FIGS. 5A and 5B are schematic plan views illustrating the effect of this embodiment, where FIG. 5A shows the device according to the comparative example, and FIG. 5B shows the device according to this embodiment.

As shown in FIG. 5A, in the nonvolatile semiconductor memory device 101 according to the comparative example of the first embodiment, denoting by $F_1$ the smallest feature size, the diameter of the through hole 18 (see FIG. 2) is $F_1$, and the diameter of the silicon pillar SP buried in the through hole 18 is less than $F_1$. The width of the upper select gate electrode USG is $2F_1$ because the through holes 18 need to be formed therein. The spacing between the upper select gate electrodes USG is $F_1$. Because the bit line BL only needs to be connected to the silicon pillars SP, its width is $F_1$, and the spacing between the bit lines BL is also $F_1$. Thus, the X-direction length of one cell is $2F_1$, its Y-direction length is $3F_1$, and hence the cell area is $6F_1^2$. Here, the shortest distance $L_1$ between the central axes of silicon pillars SP is the distance between the central axes of silicon pillars SP neighboring in the X direction, that is, $L_1=2F_1$.

In contrast, as shown in FIG. 5B, in the device 1 according to this embodiment, denoting by $F_2$ the smallest feature size, the width of the upper select gate electrode USG is $2F_2$, the spacing between the upper select gate electrodes USG is $F_2$, the width of the bit line BL is $F_2$, and the spacing between the bit lines BL is also $F_2$. The X-direction length of one cell is $2F_2$, its Y-direction length is $3F_2$, and hence the cell area is $6F_2^2$. However, because the silicon pillars SP are arranged in a staggered layout in the device 1, the straight line being orthogonal to the Z direction and connecting between the central axes of two silicon pillars SP located at the shortest distance is sloped with respect to both the extending direction (X direction) of the upper select gate electrode USG and the extending direction (Y direction) of the bit line BL. The central axes of two silicon pillars SP located at the shortest distance are spaced from each other by $2F_2$ in the X direction and by a maximum of $F_2$ in the Y direction. Hence, the shortest distance $L_2$ between the central axes of silicon pillars SP is given by the following equation (1).

$$L_2=\sqrt{(2F_2)^2+(F_2)^2}=\sqrt{5F_2^2}=\sqrt{5}\times F_2 \tag{1}$$

Equating the shortest distance $L_2$ in the device 1 with the shortest distance $L_1$ in the device 101 yields the following equation (2), which leads to the following equation (3).

$$L_1 = 2\times F_1 = \sqrt{5}\times F_2 = L_2 \tag{2}$$

$$F_2 = \frac{2}{\sqrt{5}}\times F_1 \approx 0.8944\times F_1 \tag{3}$$

As shown in the above equation (3), in the device 1 according to this embodiment, as compared with the device 101 according to the comparative example, the smallest feature size can be reduced to a maximum of approximately 89% while maintaining the shortest distance between the silicon pillars SP equally. Furthermore, as shown in the following equation (4), according to this embodiment, the cell area can be reduced to a maximum of 80%.

$$\frac{6F_2^2}{6F_1^2} = \frac{\left(\frac{2}{\sqrt{5}}\times F_1\right)^2}{F_1^2} = \frac{4}{5} = 0.8 \tag{4}$$

Thus, according to this embodiment, by arranging silicon pillars SP in a staggered layout, it is possible to reduce the cell area while maintaining the shortest distance between the silicon pillars SP to avoid interference between the silicon pillars SP. Consequently, it is possible to realize a nonvolatile semiconductor memory device with high integration density.

In a three-dimensionally stacked nonvolatile semiconductor memory device like the device 1, techniques for downscaling the memory cell include reducing the diameter of the through hole 18 and reducing the arrangement pitch of the bit lines BL. A typical technique for reducing the hole diameter is to form a hole followed by filling it back with a spacer. However, in the case of the device 1, the block insulating film 22, the charge storage film 23, and the tunnel insulating film 24 need to be formed on the side surface of the through hole 18, the tunnel insulating film 24 needs to be in contact with the silicon pillar SP, and a sufficient electric field needs to be produced between the electrode film WL and the silicon pillar SP. Hence, the through hole 18 cannot be filled back with a spacer. In contrast, reduction of the arrangement pitch of the bit lines BL can be achieved illustratively by sidewall processing. Because downscaling of the memory cell in this embodiment is based on the reduction of the arrangement pitch of the bit lines, it can be readily achieved by application of existing techniques.

It is noted that the above description with reference to FIGS. 5A and 5B is based on the ideal case in which the through holes 18 are formed at the utmost end in the width direction of the upper select gate electrode USG. In this case, the effect of reducing the smallest feature size is maximized. In the XY plane, the line segment connecting between the central axes of a pair of silicon pillars SP penetrating through the same upper select gate electrode USG and connected to neighboring bit lines is sloped approximately 26.6 degree with respect to the X direction in which the upper select gate electrode USG extends. Also in the case where the through hole 18 cannot be formed at the utmost end in the width direction of the upper select gate electrode USG, a certain effect can be achieved as long as two silicon pillars SP penetrating through the same upper select gate electrode USG and connected to neighboring bit lines are shifted in position in the Y direction. In this case, the aforementioned slope angle is smaller than 26.6 degree.

Next, a second embodiment of the invention is described.

Figure 6:
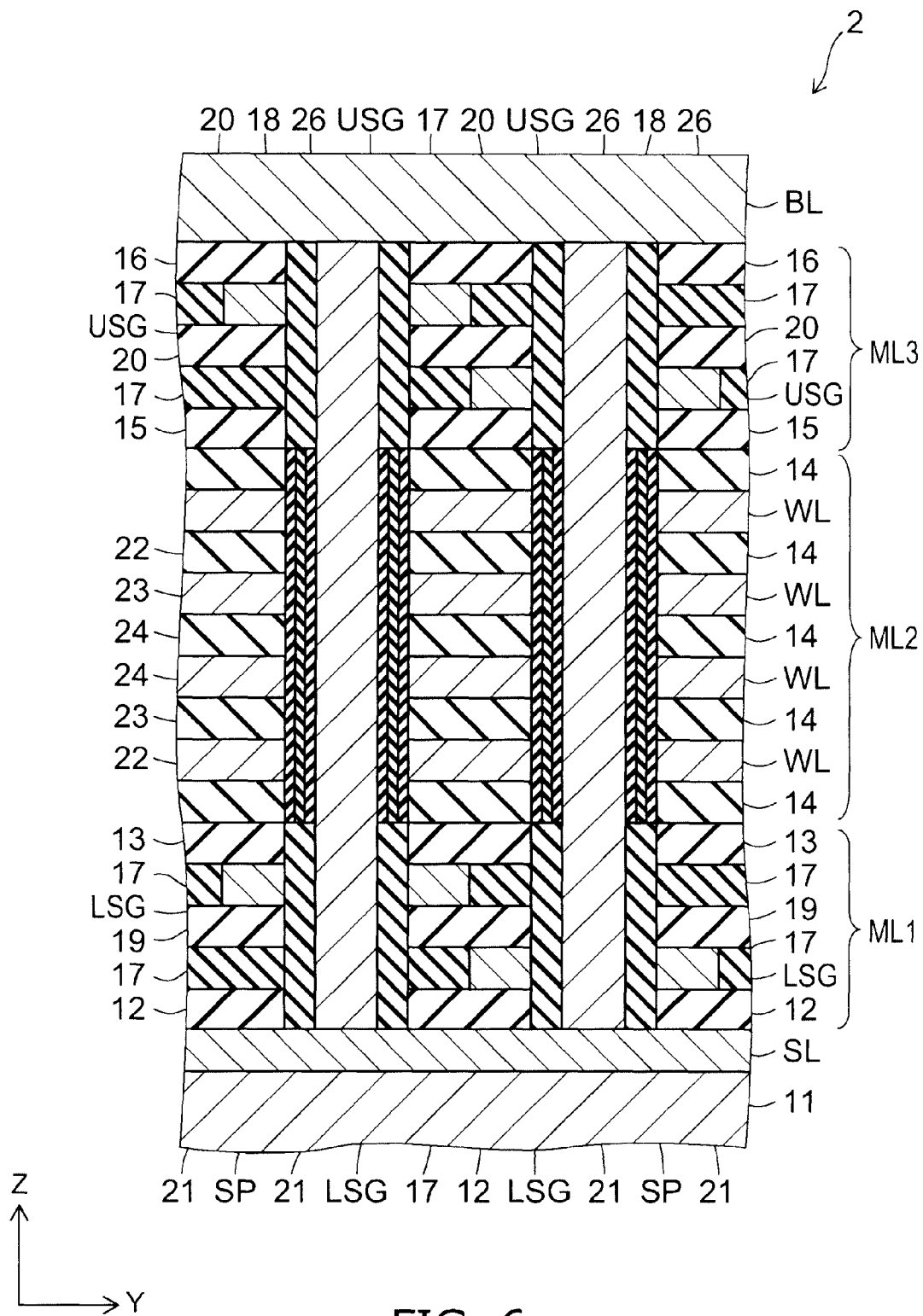
FIG. 6 is a cross-sectional view illustrating a nonvolatile semiconductor memory device according to a second embodiment of the invention.

FIG. 6 is a cross-sectional view illustrating a nonvolatile semiconductor memory device according to this embodiment.

Figure 7:
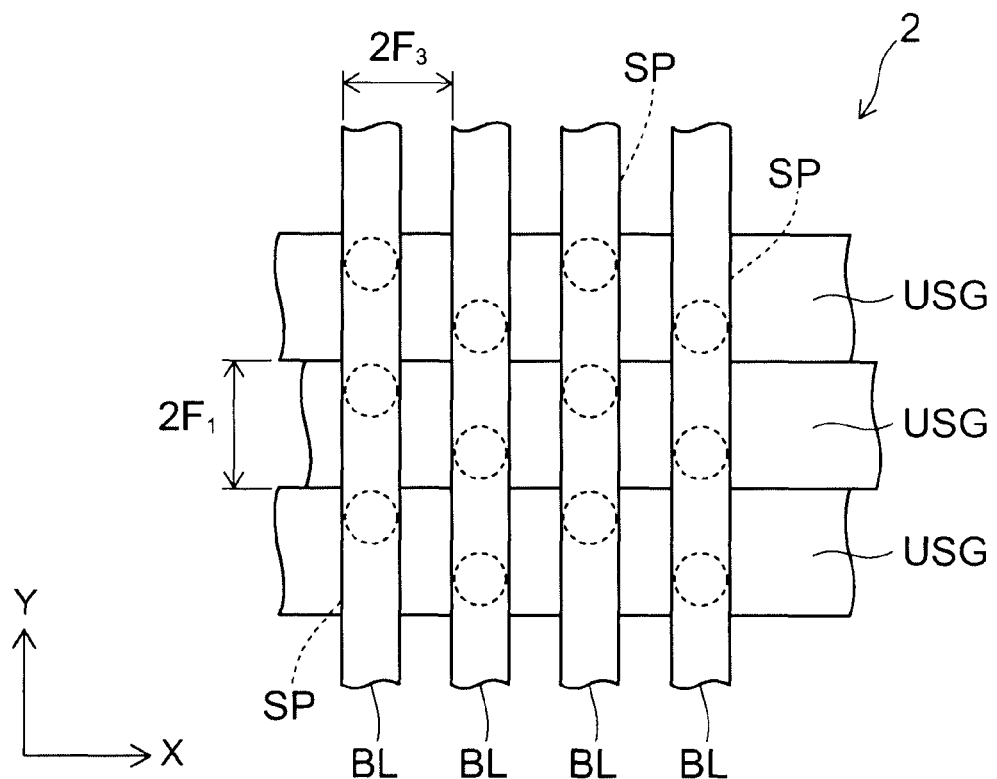
FIG. 7 is a schematic plan view illustrating how bit lines and upper select gate electrodes are positionally related to silicon pillars in the nonvolatile semiconductor memory device according to the second embodiment.

FIG. 7 is a schematic plan view illustrating how bit lines and upper select gate electrodes are positionally related to silicon pillars in the nonvolatile semiconductor memory device according to this embodiment.

As shown in FIG. 6, the nonvolatile semiconductor memory device 2 according to this embodiment is different from the device 1 (see FIG. 2) according to the above first embodiment in that the lower select gate electrodes LSG and the upper select gate electrodes USG, respectively, are located alternately in two layers spaced in the Z direction. More specifically, the lower select gate electrodes LSG are formed alternately in two layers sandwiching the insulating layer 19, and the upper select gate electrodes USG are formed alternately in two layers sandwiching the insulating layer 20. Thus, the neighboring lower select gate electrodes LSG and the neighboring upper select gate electrodes USG are respectively spaced from each other in the Z direction. Consequently, as shown in FIG. 7, the Y-direction distances between the neighboring lower select gate electrodes LSG and between the neighboring upper select gate electrodes USG can be reduce to, for instance, zero. That is, as viewed in the Z direction, the distance between the lower select gate electrodes LSG and the distance between upper select gate electrodes USG are each zero.

As shown in FIG. 7, also in this embodiment, like the above first embodiment, the silicon pillars SP are arranged in a staggered layout as viewed in the Z direction. The configuration of this embodiment other than the foregoing is the same as that of the above first embodiment.

Next, a comparative example of this embodiment is described in order to describe the operation and effect of this embodiment.

Figure 8:
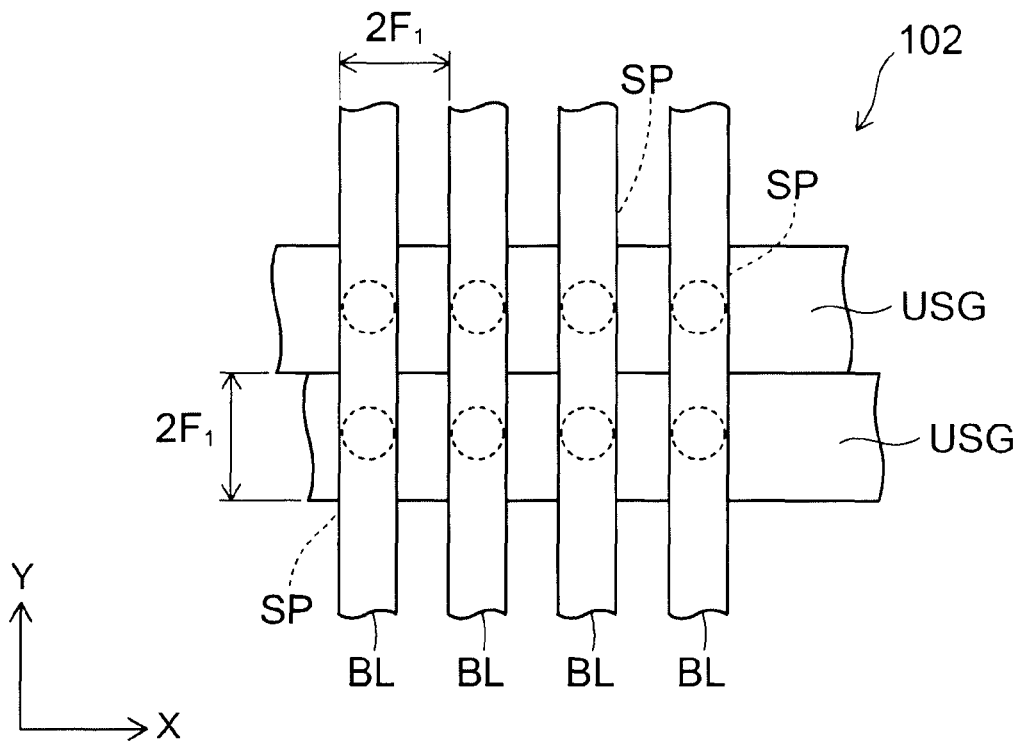
FIG. 8 is a schematic plan view illustrating how bit lines and upper select gate electrodes are positionally related to silicon pillars in a nonvolatile semiconductor memory device according to a comparative example of the second embodiment.

FIG. 8 is a schematic plan view illustrating how bit lines and upper select gate electrodes are positionally related to silicon pillars in a nonvolatile semiconductor memory device according to the comparative example of this embodiment.

As shown in FIG. 8, in the nonvolatile semiconductor memory device 102 according to this comparative example, like the second embodiment, the lower select gate electrodes LSG and the upper select gate electrodes USG are respectively located in two layers. Furthermore, like the comparative example of the above first embodiment, all the silicon pillars SP penetrate through the center in the width direction of the upper select gate electrode USG. Thus, as viewed in the Z direction, the silicon pillars SP are arranged in a matrix layout along the X and Y directions. The configuration of this comparative example other than the foregoing is the same as that of the second embodiment.

In the following, the operation and effect of this embodiment are described in comparison with the comparative example described above.

FIGS. 9A and 9B are schematic plan views illustrating the effect of this embodiment, where FIG. 9A shows the device according to the comparative example, and FIG. 9B shows the device according to this embodiment.

As shown in FIG. 9A, in the device 102 according to the comparative example, denoting by $F_1$ the smallest feature size, like the aforementioned device 101, the diameter of the through hole 18 is $F_1$, the diameter of the silicon pillar SP is less than $F_1$, and the width of the upper select gate electrode USG is $2F_1$. The width of the bit line BL is $F_1$, and the spacing between the bit lines BL is also $F_1$. However, unlike the aforementioned device 101, the spacing between the upper select gate electrodes USG in the Y direction is zero. Thus, the X-direction length of one cell is $2F_1$, its Y-direction length is $2F_1$, and hence the cell area is $4F_1^2$. Here, the shortest distance $L_1$ between the central axes of silicon pillars SP is the distance between the central axes of silicon pillars SP neighboring in the X or Y direction, that is, $L_1=2F_1$.

In contrast, as shown in FIG. 9B, in the device 2 according to this embodiment, like the above comparative example, the width of the upper select gate electrode USG is $2F_1$, and the spacing between the upper select gate electrodes USG is zero. However, denoting by $F_3$ the smallest feature size, the width of the bit line BL is $F_3$, and the spacing between the bit lines BL is also $F_3$. That is, the smallest feature size in the X direction is set to $F_3$ with the smallest feature size in the Y direction left to be $F_1$. Hence, the X-direction length of one cell is $2F_3$, its Y-direction length is $2F_1$, and the cell area is $2F_1 \times 2F_3$. However, because the silicon pillars SP are arranged in a staggered layout in the device 2, the central axes of two silicon pillars SP located at the shortest distance are spaced from each other by $2F_3$ in the X direction and by a maximum of $F_1$ in the Y direction. Hence, the shortest distance $L_3$ between the central axes of silicon pillars SP is given by the following equation (5).

$$L_2=\sqrt{(2F_3)^2+(F_1)^2} \qquad (5)$$

Equating the shortest distance $L_3$ in the device 2 with the shortest distance $L_1$ in the device 102 yields the following equation (6), which leads to the following equations (7) and (8).

$$L_1 = 2 \times F_1 = \sqrt{(2F_3)^2 + (F_1)^2} = L_3 \quad (6)$$

$$F_3 = \frac{\sqrt{3}}{2} \times F_1 \approx 0.8660 \times F_1 \quad (7)$$

$$\frac{2F_1 \times 2F_3}{4F_1^2} = \frac{F_3}{F_1} = \frac{\sqrt{3}}{2} \approx 0.8660 \quad (8)$$

As shown in the above equation (7), in the device 2 according to this embodiment, as compared with the device 102 according to the comparative example, the smallest feature size can be reduced to a maximum of approximately 87% while maintaining the shortest distance between the silicon pillars SP equally. Furthermore, as shown in the above equation (8), the cell area can also be reduced to a maximum of approximately 87%.

Thus, also in this embodiment, like the above first embodiment, by arranging silicon pillars SP in a staggered layout, it is possible to reduce the cell area while maintaining the shortest distance between the silicon pillars SP to avoid interference between the silicon pillars. Consequently, it is possible to realize a nonvolatile semiconductor memory device with high integration density.

Next, a third embodiment of the invention is described.

Figure 10:
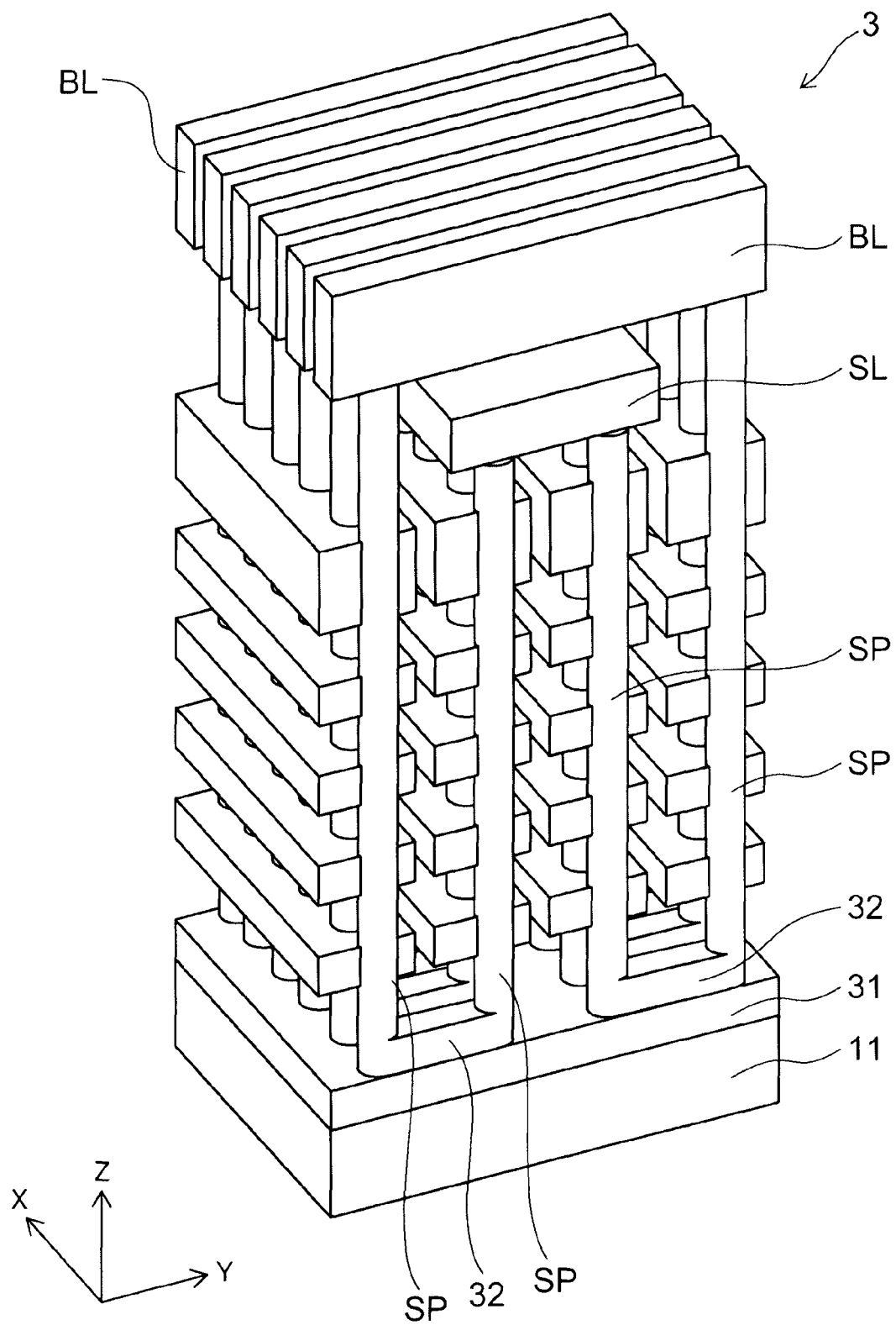
FIG. 10 is a perspective cross-sectional view illustrating a nonvolatile semiconductor memory device according to a third embodiment of the invention.

FIG. 10 is a perspective cross-sectional view illustrating a nonvolatile semiconductor memory device according to this embodiment.

As shown in FIG. 10, in the nonvolatile semiconductor memory device 3 according to this embodiment, no source line is formed in the surface portion of the silicon substrate 11, but a back gate electrode 31 is formed instead. The back gate electrode 31 is made of an impurity diffusion layer formed in the surface portion of the silicon substrate 11.

The device 3 does not include the lower gate multilayer body ML1 (see FIG. 1), but a connecting member 32 is provided between the silicon substrate 11 and the memory multilayer body ML2. The connecting member 32 is a rod-like conductive member extending in the Y direction, electrically connects between the lower ends of a pair of silicon pillars SP neighboring in the Y direction, and is formed integrally with the silicon pillars SP. The space around the connecting member 32 is buried with an insulating material (not shown).

Furthermore, in the device 3, each electrode film WL is divided corresponding to the upper select gate electrode USG, and the electrode films WL at different stages are arranged in a multistage manner immediately below one upper select gate electrode USG. That is, the electrode films WL are arranged in a matrix layout in the YZ plane and spaced from each other. Thus, in the electrode films WL, the portion penetrated by one of a pair of silicon pillars SP connected to one connecting member 32 is spaced from the portion penetrated by the other. Furthermore, the paired silicon pillars SP penetrate through mutually different upper select gate electrodes USG.

Moreover, in the device 3, a source line SL is provided between the upper select gate electrode USG and the bit line BL. The source line SL extends in the X direction, that is, a direction orthogonal to the bit line BL. The source line SL has a wider width than the upper select gate electrode USG and the electrode film WL and is located immediately above two sequences of silicon pillars SP juxtaposed in the Y direction, and these two sequences of silicon pillars SP are connected thereto. The source lines SL are provided, one for every four sequences of silicon pillars SP arranged in the X direction. Thus, of a pair of silicon pillars SP connected to the connecting member 32, one of the silicon pillars SP is connected to the source line SL, and the other is connected to the bit line BL.

Also in this embodiment, like the above first embodiment, the silicon pillars SP are arranged in a staggered layout as viewed in the Z direction. For convenience of illustration, in FIG. 10, the staggered arrangement of the silicon pillars is not represented, but they are drawn as having a simple matrix arrangement.

Also in this embodiment, like the above first embodiment, by arranging silicon pillars SP in a staggered layout, it is possible to reduce the cell area while maintaining the shortest distance between the silicon pillars SP at a certain value, thereby increasing the integration density of memory cells. The configuration, operation, and effect of this embodiment other than the foregoing are the same as those of the above first embodiment.

The invention has been described with reference to the embodiments. However, the invention is not limited to these embodiments. Those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A nonvolatile semiconductor memory device comprising:
    a multilayer body with a plurality of insulating films and electrode films alternately stacked therein;
    a plurality of select gate electrodes provided on the multilayer body, extending in one direction orthogonal to a stacking direction of the multilayer body, and spaced from each other;
    semiconductor pillars penetrating through the multilayer body and the select gate electrodes; and
    a charge storage film provided between one of the electrode films and one of the semiconductor pillars,
    two neighboring ones of the semiconductor pillars penetrating through a common one of the select gate electrodes and penetrating through mutually different positions in a width direction of the select gate electrodes, and
    a straight line being orthogonal to the stacking direction and connecting between central axes of two of the semiconductor pillars located at shortest distance, the straight line being sloped with respect to both the one direction and another direction orthogonal to the stacking direction and the one direction.

2. The device according to claim 1, further comprising:
    a plurality of bit lines provided on the select gate electrodes and extending in another direction being orthogonal to the stacking direction and crossing the one direction,
    a plurality of the semiconductor pillars penetrating through the common one of the select gate electrodes and penetrating alternately along the one direction through one side and another side in the width direction of the select gate electrodes, and a plurality of the semiconductor pillars arranged along the another direction penetrating through an identical side in the width direction of the select gate electrodes.

3. The device according to claim 2, further comprising:
a connecting member provided below the multilayer body and connecting between lower ends of a pair of the semiconductor pillars respectively penetrating through a neighboring pair of the select gate electrodes; and
a plurality of source lines provided on the select gate electrodes and extending in the one direction,
one of the pair of the semiconductor pillars being connected to one of the source lines and the other of the pair of semiconductor pillars being connected to one of the bit lines, and
a portion of one of the electrode films penetrated by the one of the pair of the semiconductor pillars being spaced from a portion penetrated by the other of the pair of semiconductor pillars.

4. The device according to claim 1, wherein a slope angle of the straight line with respect to the one direction is 26.6 degrees or less.

5. The device according to claim 1, wherein one of the electrode films is divided corresponding to a region immediately below one of the select gate electrodes.

6. The device according to claim 1, wherein the plurality of select gate electrodes are all located in an identical layer.

7. The device according to claim 1, wherein the plurality of select gate electrodes are located alternately in two layers spaced along the stacking direction.

8. The device according to claim 7, wherein as viewed in the stacking direction, a distance between neighboring ones of the select gate electrodes is zero.

9. A nonvolatile semiconductor memory device comprising:
a multilayer body with a plurality of insulating films and electrode films alternately stacked therein;
a plurality of select gate electrodes provided on the multilayer body, extending in one direction orthogonal to a stacking direction of the multilayer body, and spaced from each other;
semiconductor pillars penetrating through the multilayer body and the select gate electrodes; and
a charge storage film provided between one of the electrode films and one of the semiconductor pillars,
a straight line being orthogonal to the stacking direction and connecting between central axes of two of the semiconductor pillars located at shortest distance, the straight line being sloped with respect to both the one direction and another direction orthogonal to the stacking direction and the one direction.

10. The device according to claim 9, wherein a slope angle of the straight line with respect to the one direction is 26.6 degrees or less.

* * * * *